(12) United States Patent
Kuo (10) Patent No.: US 9,922,948 B2
(45) Date of Patent: Mar. 20, 2018

(54) SEMICONDUCTOR DEVICE WITH MODIFIED PAD SPACING STRUCTURE

(71) Applicant: UNITED MICROELECTRONICS CORP., Hsinchu (TW)

(72) Inventor: Po-Chen Kuo, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/139,958

(22) Filed: Apr. 27, 2016

(65) Prior Publication Data

US 2017/0287858 A1 Oct. 5, 2017

(30) Foreign Application Priority Data

Mar. 31, 2016 (CN) .......................... 2016 1 0195059

(51) Int. Cl.
*H01L 29/40* (2006.01)
*H01L 23/00* (2006.01)
*H01L 23/528* (2006.01)
*H01L 23/31* (2006.01)
*H01L 23/532* (2006.01)
*H01L 23/29* (2006.01)

(52) U.S. Cl.
CPC ............ *H01L 24/06* (2013.01); *H01L 23/291* (2013.01); *H01L 23/3171* (2013.01); *H01L 23/3192* (2013.01); *H01L 23/5283* (2013.01); *H01L 23/5329* (2013.01); *H01L 23/53214* (2013.01); *H01L 23/53228* (2013.01); *H01L 23/562* (2013.01); *H01L 2224/05124* (2013.01); *H01L 2224/0612* (2013.01); *H01L 2924/01029* (2013.01); *H01L 2924/05042* (2013.01); *H01L 2924/05494* (2013.01); *H01L 2924/07025* (2013.01); *H01L 2924/3512* (2013.01)

(58) Field of Classification Search
CPC ... H01L 24/06; H01L 23/291; H01L 23/3171; H01L 23/3192; H01L 23/5283; H01L 23/53228; H01L 23/53214; H01L 23/5329
See application file for complete search history.

(56) References Cited

U.S. PATENT DOCUMENTS

| | | | |
|---|---|---|---|
| 6,551,916 B2 | 4/2003 | Lin et al. | |
| 2005/0082577 A1 | 4/2005 | Usui | |
| 2006/0189007 A1 | 8/2006 | Aoki et al. | |
| 2010/0164096 A1 | 7/2010 | Daubenspeck et al. | |
| 2014/0145272 A1* | 5/2014 | Or-Bach ............ | H01L 27/0688 257/369 |

\* cited by examiner

*Primary Examiner* — Elias M Ullah
(74) *Attorney, Agent, or Firm* — WPAT, PC

(57) ABSTRACT

A semiconductor device is provided, including a substrate, an interconnection structure formed on the substrate, a first top conductive layer formed on the interconnection structure, bars formed on the interconnection structure, and a second top conductive layer formed above the first top conductive layer. The first top conductive layer includes several first conducting portions spaced apart from each other, and at least one of the bars is positioned between adjacent two of the first conducting portions.

26 Claims, 6 Drawing Sheets

SEMICONDUCTOR DEVICE WITH MODIFIED PAD SPACING STRUCTURE

This application claims the benefit of People's Republic of China application Ser. No. 201610195059.X, filed Mar. 31, 2016, the subject matter of which is incorporated herein by reference.

BACKGROUND

Technical Field

The disclosure relates in general to a semiconductor device, and more particularly to a semiconductor device with modified pad spacing structure.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages such as cracks, which have considerable effects on the electrical performance of the devices, would be one of the important issues of the device for the manufacturers.

According to the typical manufacturing method for forming the semiconductor devices such as bonding pad structure, the undesired cracks generally occur at the narrow portion of the passivation, such as the portion positioned between the pad sidewall and the pad spacing (particularly around the corner of the passivation), due to the mismatch of the coefficient of thermal expansion (CTE) between the materials of pad and passivation during the temperature change in the manufacturing process (ex: a large temperature drop between a deposition temperature and the room temperature). Therefore, the electronic properties of the semiconductor device will be degraded, and the production yield will be decreased.

SUMMARY

The disclosure is directed to a semiconductor device with modified pad spacing structure, which effectively decreases the thermal stress of the related layer such as the passivation layer, and prevents the formation of cracks during the temperature change in the manufacturing process.

According to one aspect of the present disclosure, a semiconductor device is provided, including a substrate, an interconnection structure formed on the substrate, a first top conductive layer formed on the interconnection structure, bars formed on the interconnection structure, and a second top conductive layer formed above the first top conductive layer. The first top conductive layer includes several first conducting portions spaced apart from each other, and at least one of the bars is positioned between adjacent two of the first conducting portions.

According to another aspect of the present disclosure, a semiconductor device is provided, including a substrate, an interconnection structure formed on the substrate, a first top conductive layer formed on the interconnection structure, a second top conductive layer formed above the first top conductive layer, and a passivation layer. The first top conductive layer includes several first conducting portions spaced apart from each other, and the second top conductive layer includes several second conducting portions spaced apart from each other, wherein a space between adjacent two of the second conducting portions is defined as pad spacing. The passivation layer is formed in the pad spacing and has at least a trench for segregating the passivation layer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiments of the present disclosure, a semiconductor device with modified pad spacing structure is provided. The modified pad spacing structures of the embodiments effectively decrease the thermal stress of the related layer such as the passivation layer, thereby solving the problem of passivation cracks typically occurred in the conventional bond pad structure. Embodiments are provided hereinafter with reference to the accompanying drawings for describing the related modified pad spacing structures of semiconductor devices. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
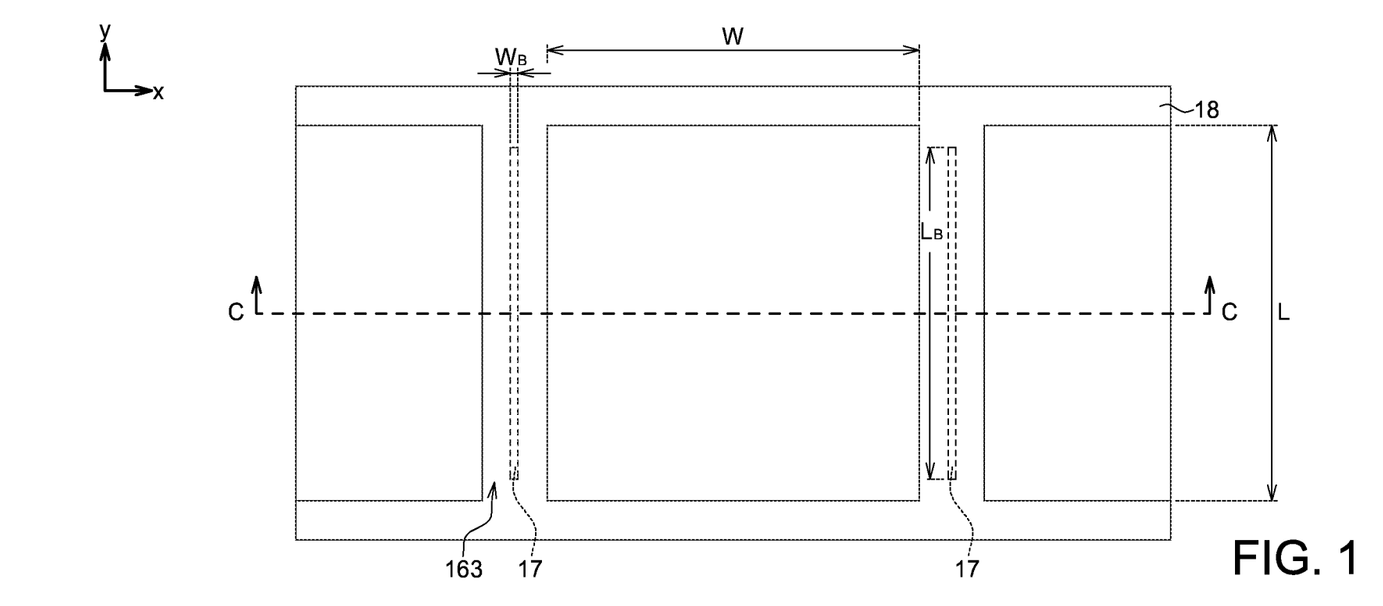
FIG. 1 is a top view of a semiconductor device with modified pad spacing structure according to an embodiment of the disclosure.
Figure 2:
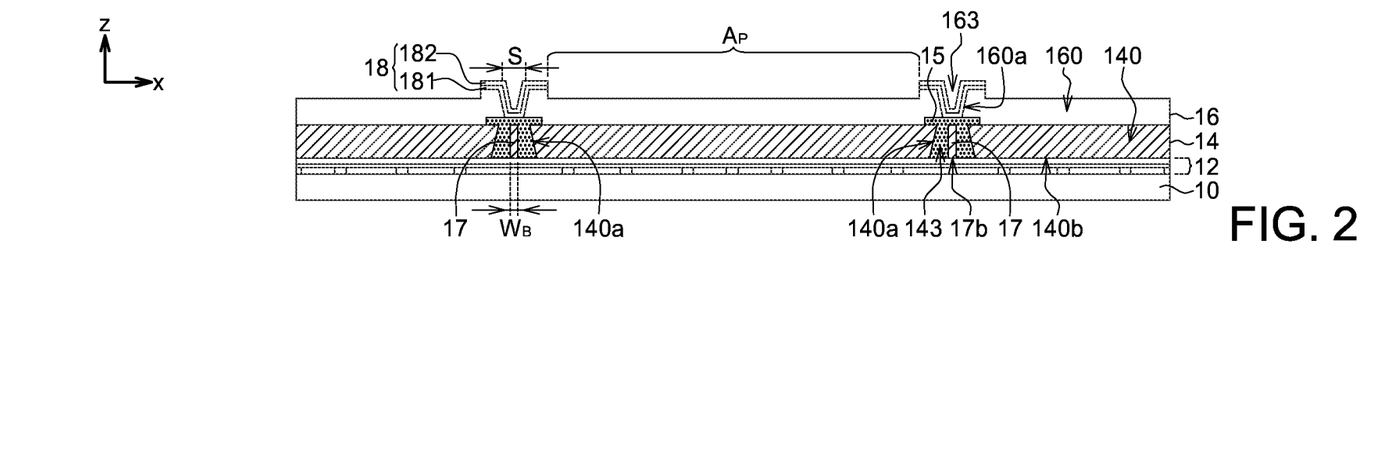
FIG. 2 is a cross-sectional view of a modified pad spacing structure Type-1 along the cross-sectional line C-C of FIG. 1.

FIG. 1 is a top view of a semiconductor device with modified pad spacing structure according to an embodiment of the disclosure. The modified pad spacing structures of the embodiments can be generally divided into three types. FIG. 2 is a cross-sectional view of a modified pad spacing structure Type-1 along the cross-sectional line C-C of FIG. 1. Please refer to FIG. 1 and FIG. 2. A semiconductor device of the embodiment comprises a substrate 10, an interconnection structure 12 formed on the substrate 10, a first top conductive layer 14 formed on the interconnection structure 12, a second top conductive layer 16 formed above the first top conductive layer 14, and the bars 17. In one embodiment, the first top conductive layer 14 can be referred as a top metal layer comprising copper (Cu) or other appropriate metals, and the second top conductive layer 16 can be referred as a pad layer, comprising aluminum (Al) or other appropriate materials. Also, the first top conductive layer 14 includes several first conducting portions 140 spaced apart from each other.

According to the embodiment, at least one of the bars 17 is positioned between adjacent two of the first conducting portions 140 (such as one bar 17 between first conducting portions 140 as shown in FIG. 1). The bar 17 is separated from the sidewalls 140a of adjacent two of the first conducting portions 140. Also, in the embodiment, the bottom surfaces 17b of the bars 17 are substantially aligned with a bottom surface 140b of the first top conductive layer 14.

In the embodiment, the bars 17 comprise metal (such as Cu or Al or other suitable metal with high CTE), or metal oxide, or polymer (such as polyimide (PI)(CTE: Cu=16.3 ppm/° C., Al=23 ppm/° C., PI=35 ppm/° C., oxide=4-5 ppm/° C.). Material of the bars 17 can be determined according to the requirements of the applications; for example, the material of the bars 17 can be identical to the material of the first top conductive layer 14 for process concern (i.e. the bars 17 and the first top conductive layer 14 are formed simultaneously), but the present disclosure is not particularly limited thereto.

Also, the second top conductive layer 16 includes several second conducting portions 160 spaced apart from each other, and the second conducting portions 160 can be defined as pads. A space 163 between adjacent two of the second conducting portions 160 can be defined as a pad spacing S. Moreover, a passivation layer 18 is formed in the pad spacing S and covers at least the sidewalls 160a of the pads (i.e. the second conducting portions 160). For some embodiments (ex: Type-1 as shown in FIG. 2 and Type-2 described later), the bar 17 is separated from the passivation layer 18. In one embodiment, the passivation layer 18 can be a multi-layer, comprising such as a first passivation portion 181 (ex: phosphosilicate glass (PSG) layer) and a second passivation portion 182 (ex: SiN layer) formed on the first passivation portion 181, as shown in FIG. 2.

Figure 3:
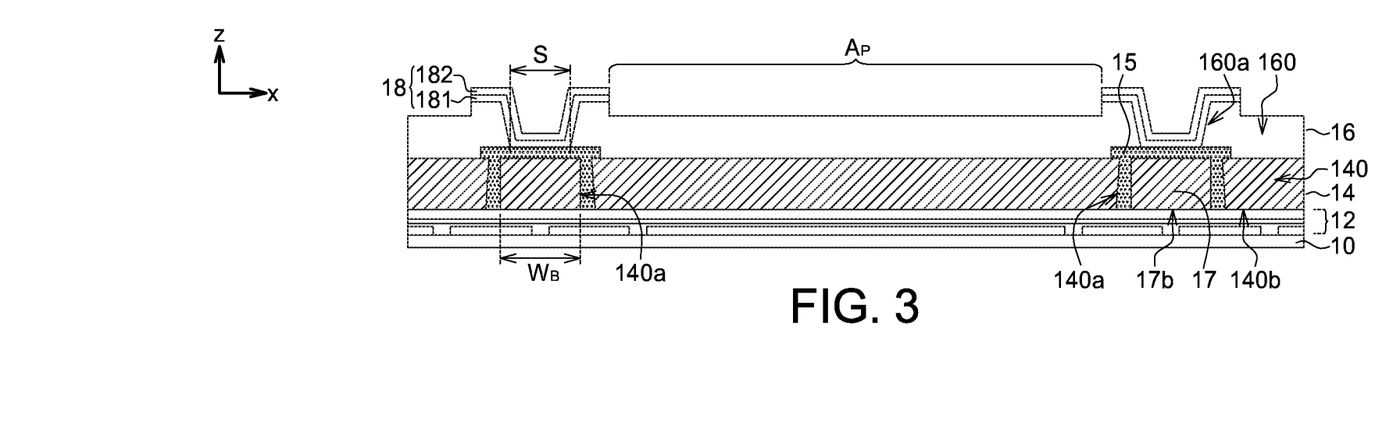
FIG. 3 is a cross-sectional view of a further modified pad spacing structure Type-1 according to an embodiment of the disclosure, which depicts the bar width $W_B$ is larger than the pad spacing S.
Figure 4:
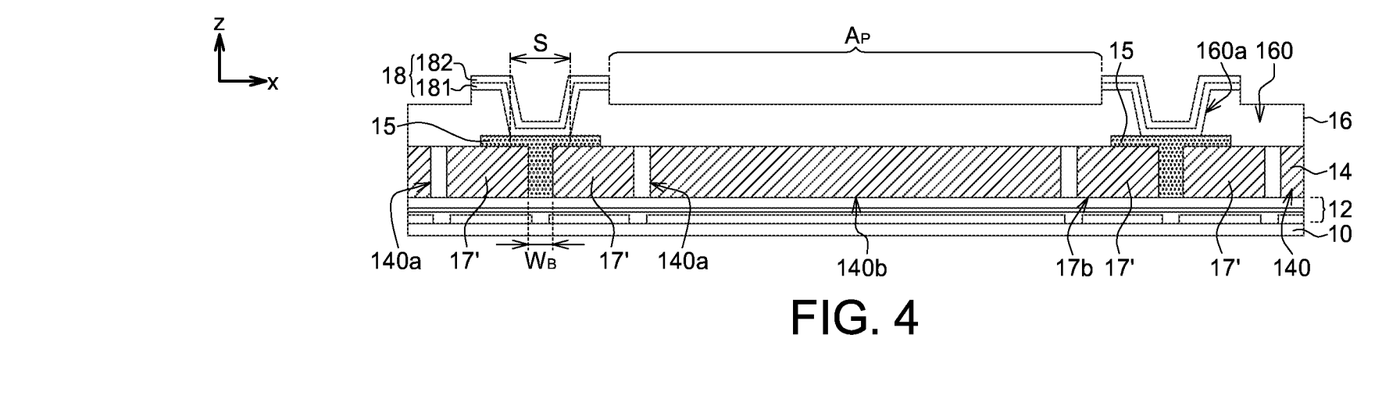
FIG. 4 is a cross-sectional view of another modified pad spacing structure Type-1 according to an embodiment of the disclosure.

According to the embodiment, one of the pads (i.e. the second conducting portions 160) has a pad region $A_P$ with an opening width W along a first direction (such as x direction) and an opening length L along a second direction (such as y direction). The bar 17 has a bar width $W_B$ along the first direction (such as x direction) and a bar length $L_B$ along the second direction (such as y direction), wherein the pad spacing S is determined along the first direction (such as x direction), as shown in FIG. 1. There are several configurations of the bars 17 in the embodiments, and three of them are illustrated in FIG. 2, FIG. 3 and FIG. 4. In one embodiment, the bar width $W_B$ is shorter than the pad spacing S, as shown in FIG. 2. However, the present disclosure has no limitation thereto, the bar width can be shorter or larger than the pad spacing, depending on the design requirements of the application. FIG. 3 is a cross-sectional view of a further modified pad spacing structure Type-1 according to an embodiment of the disclosure, which depicts the bar width $W_B$ is larger than the pad spacing S. In one embodiment, the bar width $W_B$ is in a range of 20% to 200% of the pad spacing S.

Additionally, FIG. 1-3 depict one bar 17 being formed between the two adjacent first conducting portions 140; however, the present disclosure is not limited thereto, and two or more bars can be formed between the two adjacent first conducting portions 140. Please refer to FIG. 4, which is a cross-sectional view of another modified pad spacing structure Type-1 according to an embodiment of the disclosure, wherein two bars 17' are formed between the two adjacent first conducting portions 140, and slightly overlap with the pad region $A_P$. Also, the two bars 17' are not only separated from each other but also separated from the sidewalls 140a of the adjacent two of the first conducting portions 140. Other identical and/or similar elements of FIG. 2-FIG. 4 designated with the same and/or similar reference numerals are not redundantly described.

Figure 5:
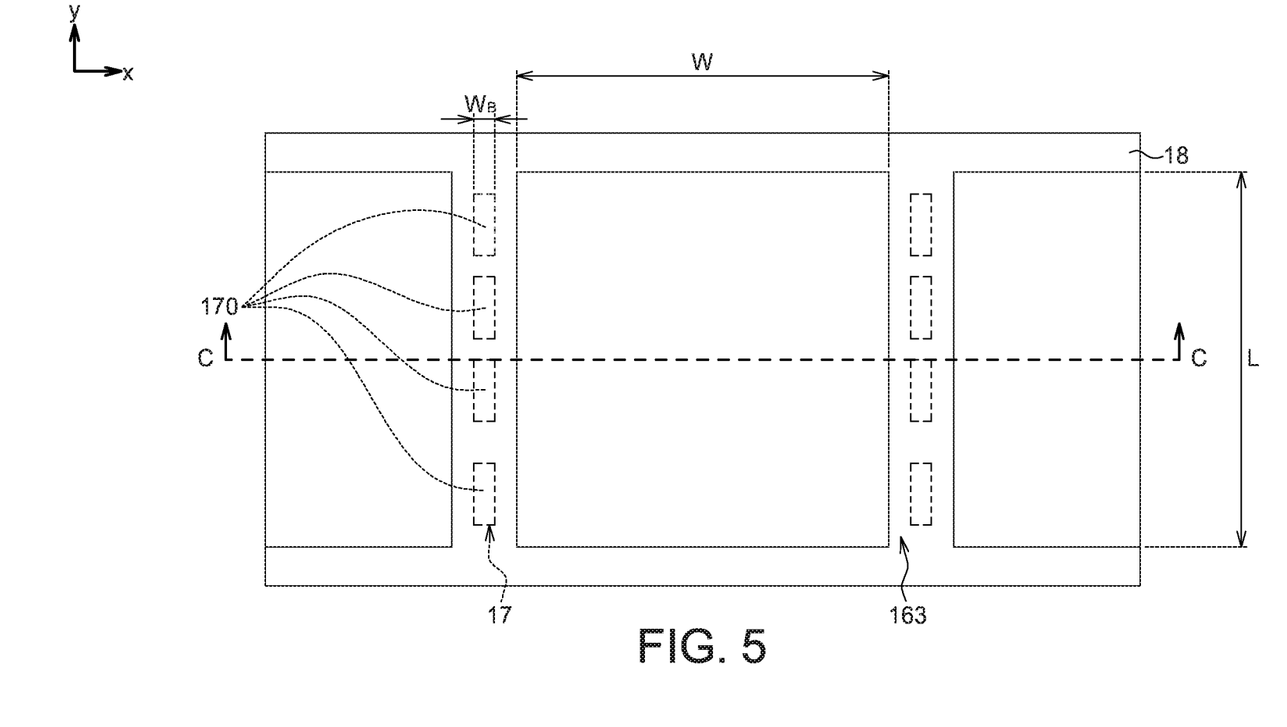
FIG. 5 is a top view of another semiconductor device with modified pad spacing structure according to an embodiment of the disclosure.

Moreover, the bars 17 of the embodiment can be continuous or intermittent, and the present disclosure has no limitation thereto. According to the embodiment, the bar 17 can be a continuous piece positioned between the adjacent first conducting portions 140 as shown in FIG. 1, and can comprise a plurality intermittent pieces 170 positioned between the adjacent first conducting portions 140 as shown in FIG. 5 alternatively. FIG. 5 is a top view of another semiconductor device with modified pad spacing structure according to an embodiment of the disclosure.

Figure 6:
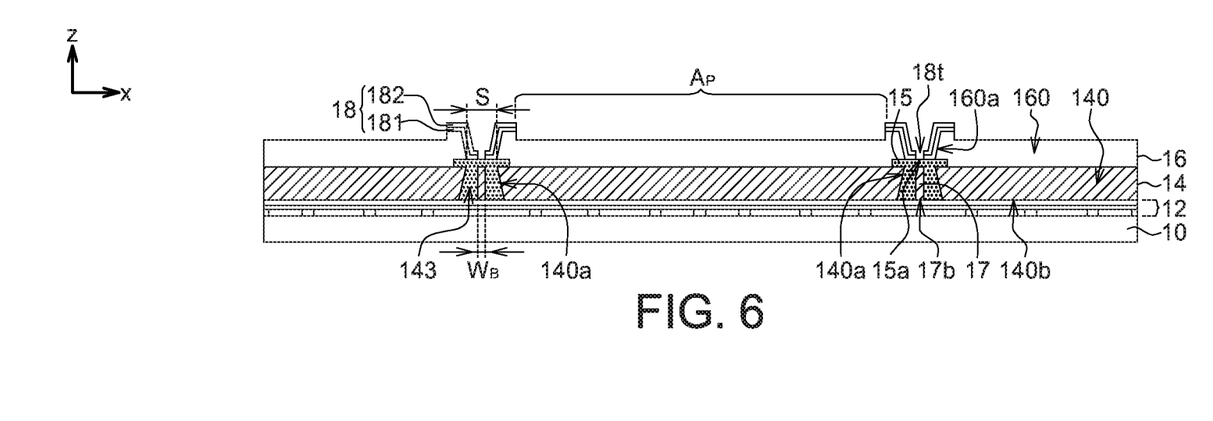
FIG. 6 is a cross-sectional view of a modified pad spacing structure Type-2 according to the embodiment of the disclosure.
Figure 7:
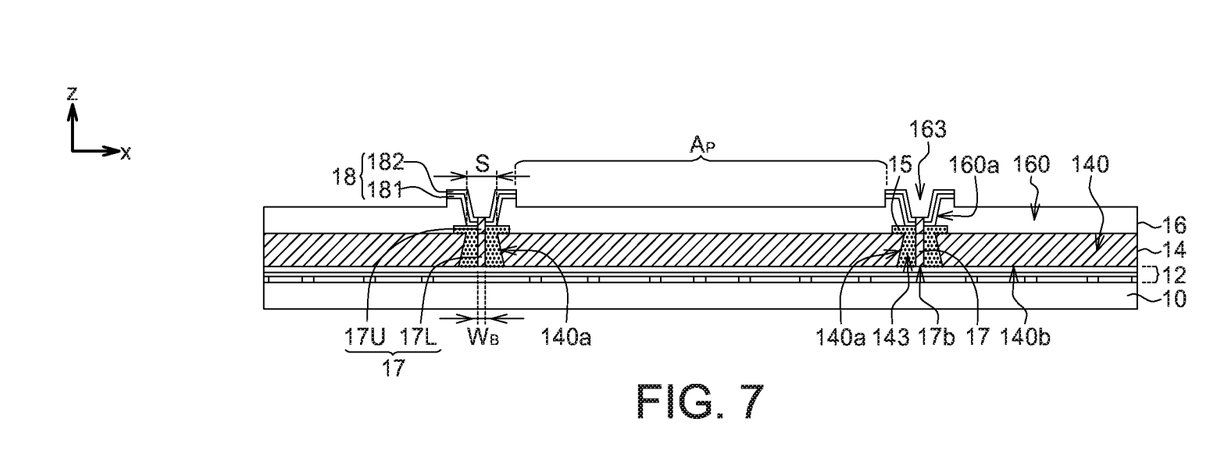
FIG. 7 is a cross-sectional view of a modified pad spacing structure Type-3 according to the embodiment of the disclosure.

Besides Type-1 (as illustrated in FIG. 2 to FIG. 4), there are other types of the modified pad spacing structures in the embodiments of the disclosure according to the configurations of the passivation layer 18 and the bars 17. The passivation layer 18 of the embodiments can be continuous or disconnected (ex: having at least a trench 18t to segregate the passivation layer 18). The disconnection of the passivation layer 18 further decreases the thermal stress of the passivation layer 18. FIG. 6 is a cross-sectional view of a modified pad spacing structure Type-2 according to the embodiment of the disclosure. FIG. 7 is a cross-sectional view of a modified pad spacing structure Type-3 according to the embodiment of the disclosure. Please refer to the descriptions above for the identical details of the same elements (designated with the same reference numerals) in FIG. 2-FIG. 7, which are not redundantly repeated hereinafter.

In the modified pad spacing structure Type-1, the spaces 143 between the first conducting portions 140 are filled with an insulating layer 15 made of the insulation material, such as oxide, wherein the insulating layer 15 cover the bars 17, as shown in FIG. 2. In the modified pad spacing structure Type-1, the top surfaces of the bars are substantially aligned with a top surface of the first top conductive layer. The insulating layer 15 is formed corresponding to the space 163 between the second conducting portions 160.

In the modified pad spacing structure Type-2, the passivation layer 18 has at least a trench 18t within the space 163 between the adjacent two second conducting portions 160, as shown in FIG. 6. The spaces 143 between the first conducting portions 140 are also filled with the insulating layer 15 (such as the oxide layer), wherein the insulating layer 15 covers the bars 17 (i.e. the bars 17 separated from the passivation layer 18), and the trench 18t exposes the insulating layer 15; for example, the trench 18t exposes the top surface 15a of the insulating layer 15.

In the modified pad spacing structure Type-3, the insulating layer 15 (such as the oxide layer) also fills the spaces 143 between the adjacent first conducting portions 140, and the passivation layer 18 has a trench 18t within the space 163 between the adjacent two second conducting portions 160, as shown in FIG. 7. In Type-3, the trench 18t exposes the bar 17, and the bar extends to the passivation layer 18. In FIG. 7, each bar 17 may include a lower portion 17L and an upper portion 17U formed on the lower portion 17L. In one practical application, the lower portion 17L of the bar and the first conducting portions 140 can be formed in the same step, and the upper portion 17U of the bar can be formed after formation of the trench 18t. The lower portion 17L and the upper portion 17U of the bar 17 can be made of the materials with high CTE (preferably in a range of 0.5 ppm/° C. to 60 ppm/° C.). The materials of the lower portion 17L and the upper portion 17U can be different or the same, the present disclosure has not limitation thereto.

The embodiments of the present disclosure can be widely applied in the applications with different bonding pad structures. In the first-type application with the embodied bonding pad structure, as shown in FIG. 2-FIG. 4, FIG. 6 and FIG. 7, the insulating layer 15 is formed corresponding to the space 163 between the second conducting portions 160, wherein the first top conductive layer 14 and the second top conductive layer 16 contact each other (i.e. the second top conductive layer 16 is formed directly on the first top conductive layer 14) in the pad region $A_P$. However, the disclosure is not limited thereto.

Figure 8A:
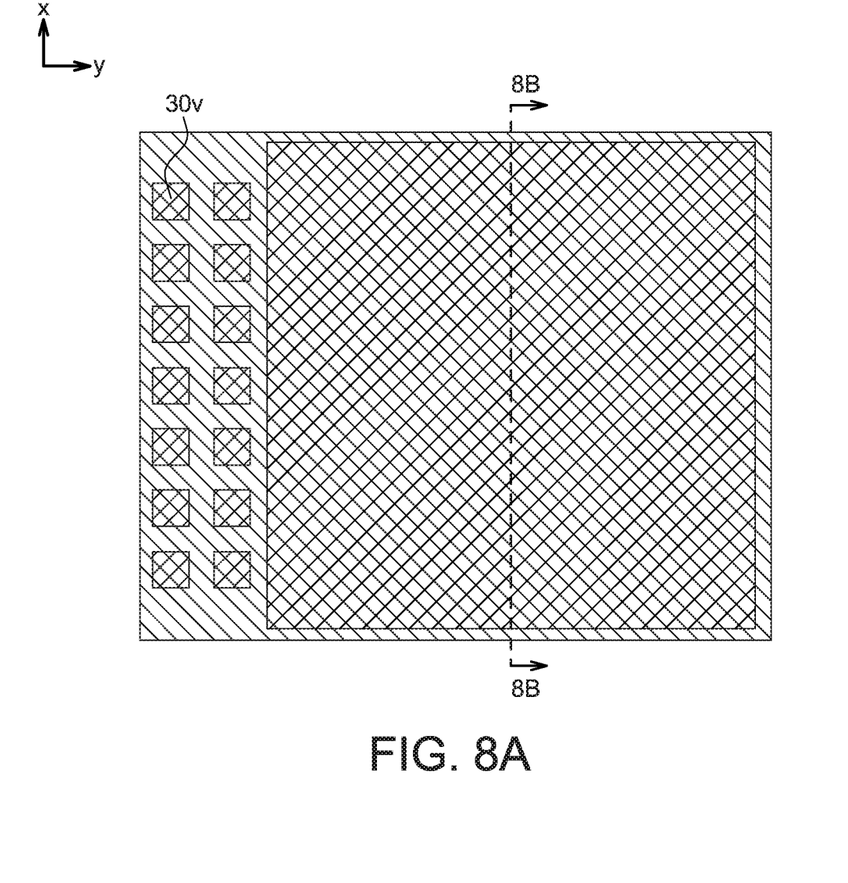
FIG. 8A is a top view illustrating a semiconductor device having a bonding pad structure of the embodiment adopted in the second-type application.
Figure 8B:
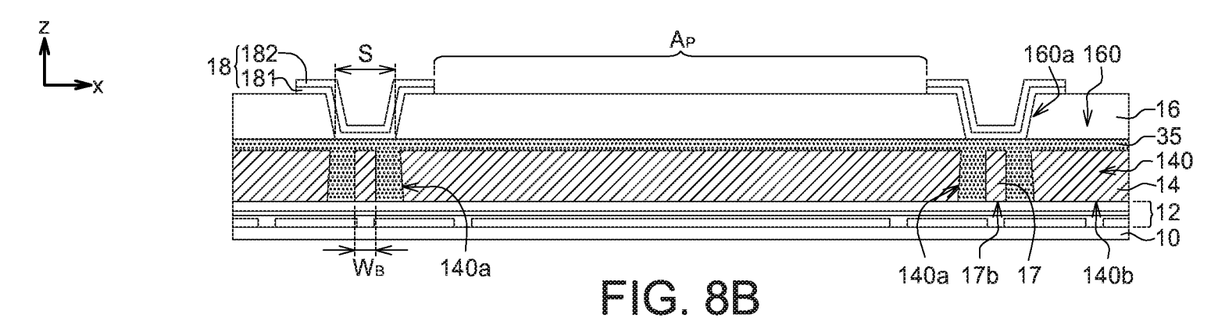
FIG. 8B is a cross-sectional view of the modified pad spacing structure of the embodiment along the cross-sectional line 8B-8B of FIG. 8A.
Figure 9:
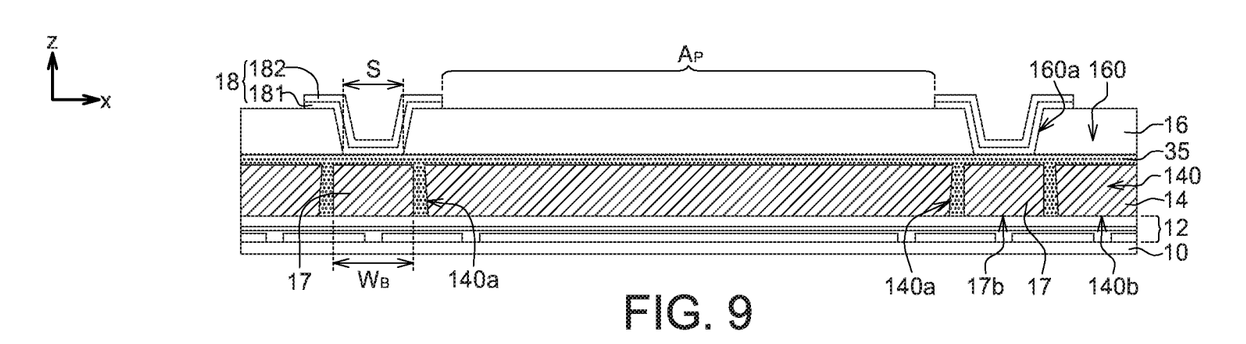
FIG. 9 is a cross-sectional view of another modified pad spacing structure of a semiconductor device of the embodiment adopted in the second type of application.

FIG. 8A is a top view illustrating a semiconductor device having a bonding pad structure of the embodiment adopted in the second-type application. FIG. 8B is a cross-sectional view of the modified pad spacing structure of the embodiment along the cross-sectional line 8B-8B of FIG. 8A. In the bonding pad structure of the second type application, the semiconductor device comprises a dielectric layer 35 formed on the first top conductive layer 14, wherein the second top conductive layer 16 is formed on the dielectric layer 35 and electrically connects the first top conductive layer 14 through the vias 30v (FIG. 8A) of the dielectric layer 35. Moreover, similar to the configuration of FIG. 2, the bar width $W_B$ of the bar 17 in FIG. 8A is shorter than the pad spacing S. Also, similar to the configuration of FIG. 3, the bar width $W_B$ of the bar 17 in FIG. 9 can be larger than the pad spacing S. FIG. 9 is a cross-sectional view of another modified pad spacing structure of a semiconductor device of the embodiment adopted in the second type of application.

Stress comparison are also investigated in the embodiment, by comparing an original pad spacing structure (i.e. no bars between the first conducting portions 140 and no disconnection of the passivation layer 18) and the modified pad spacing structures Type-1, Type-2 and Type-3. In three types of the modified structure of pad spacing, the thermal stress of the related layers, such as the passivation layer 18, the insulating layer 15 (ex: oxide layer, wherein the bars 17 are formed in the insulating layer 15) and the dielectric layer of interconnection structure 12 are simulated for stress comparison. The simulation results have indicated that the modified pad spacing structures of the embodiments do effectively decrease the thermal stress of the related layer; for example, the modified pad spacing structure Type-1 decreases at least 5% of the thermal stress of the passivation layer, and the modified pad spacing structure Type-3 decreases 10%-50% of the thermal stress of the passivation layer. Also, the embodied structures having the pad spacing 2 μm (and the bar with smaller bar width) and the pad spacing 3.8 μm (and the bar with larger bar width) are chosen for conducting the simulations, and the simulation results have indicated that the wider bars further decrease the thermal stress of the related layer.

According to the aforementioned descriptions, without changing the structure under the pads, the semiconductor devices with modified pad spacing structures of the embodiments, such as formation of bars and/or disconnection of the passivation layer, do effectively decrease the thermal stress of the related layer such as the passivation layer. The problem of passivation cracks typically occurred in the conventional bond pad structure can be successfully solved. Thus, the proposed structures provide a way for effectively preventing the related layers from damage, thereby increasing the yield of the semiconductor device. Additionally, the embodied design is compatible with the current fabrication process of the semiconductor devices, which is suitable for mass production.

Other embodiments with different configurations of known elements in the semiconductor devices can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   an interconnection structure formed on the substrate;
   a first top conductive layer formed on the interconnection structure, and the first top conductive layer comprising a plurality of first conducting portions spaced apart from each other, wherein the plurality of first conducting portions physically contact the interconnection structure;
   bars disposed in an insulating layer, and the bars formed on and physically contacting the interconnection structure, and at least one of the bars positioned between adjacent two of the plurality of first conducting portions and spaced apart from said adjacent two of the plurality of first conducting portions; and a second top conductive layer formed above the first top conductive layer.

2. The semiconductor device according to claim 1, wherein said at least one of the bars is spaced apart sidewalls of said adjacent two of the plurality of first conducting portions by the insulating layer.

3. The semiconductor device according to claim 1, wherein bottom surfaces of the bars are substantially aligned with a bottom surface of the first top conductive layer.

4. The semiconductor device according to claim 1, wherein top surfaces of the bars are substantially aligned with a top surface of the first top conductive layer.

5. The semiconductor device according to claim 1, wherein two or more of the bars are positioned between said adjacent two of the plurality of first conducting portions, and said two or more of the bars are not only separated from each other but also separated from sidewalls of said adjacent two of the plurality of first conducting portions.

6. The semiconductor device according to claim 1, wherein the bars comprise metal or metal oxide or polymer.

7. The semiconductor device according to claim 1, wherein spaces between the plurality of first conducting portions are filled with the insulating layer and the insulating layer covers the bars.

8. The semiconductor device according to claim 1, wherein the second top conductive layer comprises a plurality of second conducting portions spaced apart from each other, the plurality of second conducting portions are defined as pads, and a space between adjacent two of the plurality of the second conducting portions is defined as a pad spacing.

9. The semiconductor device according to claim 8, wherein one of the pads has an opening width W along a first direction and an opening length L along a second direction, said at least one of the bars has a bar width $W_B$ along the first direction and a bar length $L_B$ along the second direction, and said pad spacing is determined along the first direction.

10. The semiconductor device according to claim 9, wherein the bar width $W_B$ is shorter than the pad spacing.

11. The semiconductor device according to claim 9, wherein the bar width $W_B$ is larger than the pad spacing.

12. The semiconductor device according to claim 9 wherein the bar width $W_B$ is in a range of 20% to 200% of the pad spacing.

13. The semiconductor device according to claim 8, wherein a passivation layer is formed in the pad spacing and covers at least sidewalls of the pads correspondingly.

14. The semiconductor device according to claim 13, wherein the passivation layer comprises at least a trench positioned between said adjacent two of the plurality of the second conducting portions.

15. The semiconductor device according to claim 14, wherein spaces between the first conducting portions are filled with the insulating layer, wherein the insulating layer covers the bars, and said trench exposes the insulating layer.

16. The semiconductor device according to claim 14, wherein said trench further exposes said at least one of the bars, and said at least one of the bars extends to the passivation layer.

17. The semiconductor device according to claim 1, wherein the second top conductive layer is directly formed on the first top conductive layer.

18. The semiconductor device according to claim 1, further comprising a dielectric layer formed on the first top conductive layer, wherein the second top conductive layer is formed on the dielectric layer and electrically connects the first top conductive layer through vias of the dielectric layer.

19. The semiconductor device according to claim 1, wherein said at least one of the bars is a continuous piece positioned between said adjacent two of the plurality of first conducting portions.

20. The semiconductor device according to claim 1, wherein said at least one of the bars comprises a plurality of intermittent pieces positioned between said adjacent two of the plurality of first conducting portions.

21. A semiconductor device, comprising:
a substrate;
an interconnection structure formed on the substrate;
a first top conductive layer formed on the interconnection structure, and the first top conductive layer comprising a plurality of first conducting portions spaced apart from each other, and the plurality of first conducting portions physically contacting the interconnection structure, wherein spaces between the plurality of first conducting portions are filled with an insulating layer;
bars disposed in the insulating layer, and the bars formed on and physically contacting the interconnection structure, and at least one of the bars positioned between adjacent two of the plurality of first conducting portions, wherein the bars and the insulating layer are made of different materials;
a second top conductive layer formed above the first top conductive layer, and the second top conductive layer comprising a plurality of second conducting portions spaced apart from each other, wherein a space between adjacent two of the plurality of the second conducting portions is defined as a pad spacing; and
a passivation layer formed in the pad spacing and comprising at least a trench to segregate the passivation layer.

22. The semiconductor device according to claim 21, wherein said at least one of the bars is spaced apart from sidewalls of said adjacent two of the plurality of first conducting portions.

23. The semiconductor device according to claim 21, wherein bottom surfaces of the bars are substantially aligned with a bottom surface of the first top conductive layer.

24. The semiconductor device according to claim 21, wherein said at least one of the bars is separated from the passivation layer.

25. The semiconductor device according to claim 21, wherein the insulating layer covers the bars, wherein at least the trench of the passivation layer exposes the insulating layer.

26. The semiconductor device according to claim 21, wherein at least the trench is positioned correspondingly between said adjacent two of the plurality of the second conducting portions, wherein the trench further exposes said at least one of the bars, and said at least one of the bars extends to the passivation layer.

* * * * *